(12) United States Patent
Wang et al.

(10) Patent No.: US 11,139,183 B2
(45) Date of Patent: Oct. 5, 2021

(54) SYSTEMS AND METHODS FOR DRY WAFER TRANSPORT

(71) Applicant: Taiwan Semiconductor Manufacturing Co., Ltd., Hsinchu (TW)

(72) Inventors: Tsui-Wei Wang, Hsinchu (TW); Yung-Li Tsai, Houlong Town (TW); Chui-Ya Peng, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 15/988,326

(22) Filed: May 24, 2018

(65) Prior Publication Data

US 2019/0362990 A1 Nov. 28, 2019

(51) Int. Cl.
| H01L 21/67 | (2006.01) |
| H01L 21/687 | (2006.01) |
| B08B 3/04 | (2006.01) |
| H01L 21/02 | (2006.01) |

(52) U.S. Cl.
CPC ......... *H01L 21/67051* (2013.01); *B08B 3/04* (2013.01); *H01L 21/02057* (2013.01); *H01L 21/68707* (2013.01); *H01L 21/68764* (2013.01)

(58) Field of Classification Search
CPC ........ H01L 21/67051; H01L 21/67739; H01L 21/67742; H01L 21/67748; H01L 21/68707
See application file for complete search history.

(56) References Cited

U.S. PATENT DOCUMENTS

| 4,718,975 A * | 1/1988 | Bowling ........... H01L 21/67766 118/50.1 |
| 5,785,068 A | 7/1998 | Sasaki et al. |
| 5,882,433 A | 3/1999 | Ueno |
| 7,226,514 B2 | 6/2007 | Husain et al. |
| 7,611,589 B2 | 11/2009 | Wu et al. |
| 2002/0062840 A1 | 5/2002 | Verhaverbeke et al. |
| 2005/0238464 A1 * | 10/2005 | Matsuoka ......... H01L 21/67173 414/217 |

(Continued)

FOREIGN PATENT DOCUMENTS

| CN | 106170876 A | 11/2016 |
| JP | 2000040730 A | 2/2000 |

(Continued)

OTHER PUBLICATIONS

JP2013247283—Machine Translation (Year: 2013).*
JP2003092335—Machine Translation (Year: 2003).*

*Primary Examiner* — Marc Lorenzi
(74) *Attorney, Agent, or Firm* — Duane Morris LLP

(57) ABSTRACT

In an embodiment, a system includes: a first robotic arm configured to transport a wafer into a cleaning chamber, wherein the first robotic arm comprises a first hood that substantially covers the wafer when transported on the first robotic arm; the cleaning chamber configured to clean the wafer; a second robotic arm configured to transport the wafer out of the cleaning chamber, wherein the second robotic arm comprises a second hood that substantially covers the wafer when transported on the second robotic arm, wherein the second robotic arm is different than the first robotic arm.

20 Claims, 15 Drawing Sheets

(56) References Cited

U.S. PATENT DOCUMENTS

| | | | |
|---|---|---|---|
| 2005/0284369 A1* | 12/2005 | Miya | H01L 21/67784 |
| | | | 118/500 |
| 2006/0035475 A1 | 2/2006 | Verhaverbeke et al. | |
| 2009/0028672 A1* | 1/2009 | Yamawaku | H01L 21/67766 |
| | | | 414/217 |
| 2010/0068010 A1* | 3/2010 | Jhong | H01L 21/67742 |
| | | | 414/222.01 |
| 2012/0312336 A1* | 12/2012 | Itoh | H01L 21/67051 |
| | | | 134/36 |
| 2018/0040489 A1* | 2/2018 | Fehkuhrer | B26F 3/004 |
| 2018/0127864 A1 | 5/2018 | Latchford | |
| 2019/0378729 A1* | 12/2019 | Randhawa | H01L 21/67051 |

FOREIGN PATENT DOCUMENTS

| | | | | |
|---|---|---|---|---|
| JP | 2003092335 A | * | 3/2003 | |
| JP | 2013247283 A | * | 12/2013 | H01L 21/67781 |

\* cited by examiner

SYSTEMS AND METHODS FOR DRY WAFER TRANSPORT

BACKGROUND

Integrated circuits are formed on wafers, or semiconductor substrates. The formation of the integrated circuits may include numerous processing steps such as deposition of various layers, etching, and baking. The integrated circuits may be separated into individual dies, which are packaged and attached to circuit boards.

During the various processing steps to create the integrated circuits, various surfaces are formed on the surface of the wafer. Also, artifacts may be deposited along the surface of the wafer during processing. Accordingly, it may be desirable to clean the wafer of these artifacts in order to increase the production yield of the wafers.

One method of cleaning and drying wafers is spin cleaning. Spin cleaning involves dispensing a liquid cleaning solution onto the wafer and spinning the wafer to remove the solution, and thus, drying the wafer. However, in the course of spin cleaning, the liquid cleaning solution may splatter or condense on a surface of a cleaning chamber within which spin cleaning is performed. This splattered or condensed liquid cleaning solution may then drip or form on a wafer being transported to or from spin cleaning, thus sullying the wafer. Therefore, conventional techniques of transporting wafers are not entirely satisfactory.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion.

DETAILED DESCRIPTION OF EXEMPLARY EMBODIMENTS

Figure 1:
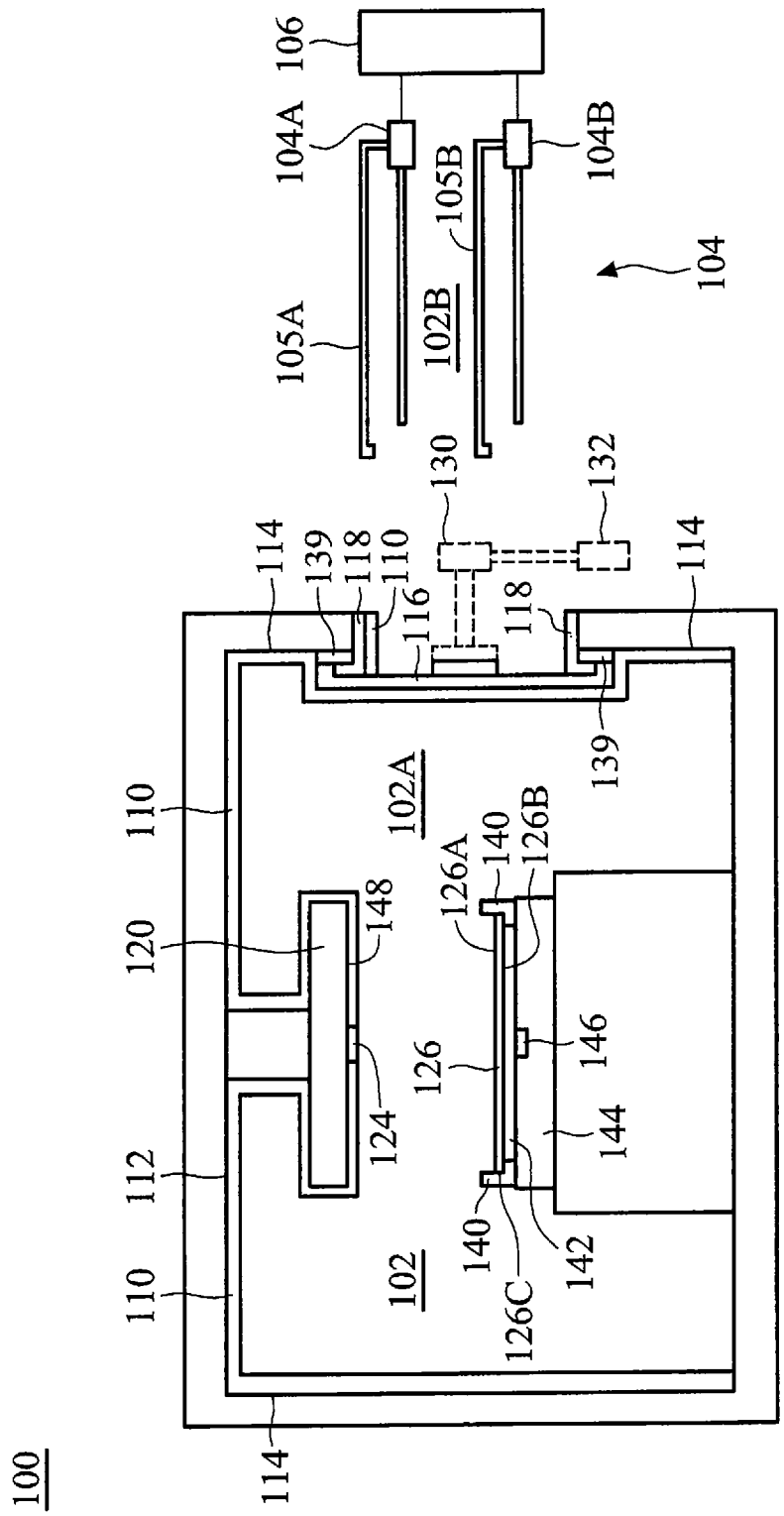
FIG. 1 is a diagram of a dry wafer transport system, in accordance with some embodiments.

The following disclosure describes various exemplary embodiments for implementing different features of the subject matter. Specific examples of components and arrangements are described below to simplify the present disclosure. These are, of course, merely examples and are not intended to be limiting. For example, it will be understood that when an element is referred to as being "connected to" or "coupled to" another element, it may be directly connected to or coupled to the other element, or one or more intervening elements may be present.

In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As noted above, undesirable artifacts may be cleaned from a wafer by applying a liquid cleaning solution to a wafer. The liquid cleaning solution may be applied to a wafer within a cleaning chamber. The liquid cleaning solution may be applied to the wafer by immersing the wafer within the liquid cleaning solution and/or applying the liquid cleaning solution to the wafer. In certain embodiments, while the liquid cleaning solution is applied to the wafer, the wafer may also be spun to distribute the liquid cleaning solution along the wafer (e.g., spin cleaning). However, in the course of cleaning a wafer with a liquid cleaning solution, the liquid cleaning solution may deposit along the surface of the cleaning chamber. This deposition may come from the liquid cleaning solution splashing off of a surface to deposit on a surface of the cleaning chamber. This deposition may also be due to condensation of the liquid cleaning solution as a vapor along a surface of the cleaning chamber. When the liquid cleaning solution is deposited along the cleaning chamber, it may also drip or fall upon a wafer being transported within the cleaning chamber, causing undesirable damage or exposure of the transported wafer to the liquid cleaning solution (e.g., exposed to the liquid cleaning solution outside of the intended use environment of the liquid cleaning solution).

Accordingly, the present disclosure provides various embodiments of a dry wafer transport system. The dry wafer transport system may include a hooded robotic arm and/or a hydrophobic chamber. The hydrophobic chamber may be a cleaning chamber that includes at least one surface covered with a hydrophobic layer. Also, the hooded robotic arm may include a robotic arm with a hood over the robotic arm that covers a wafer secured by the robotic arm as the robotic arm transports the wafer. In certain embodiments, the dry wafer transport system may include both the hooded robotic arm and the hydrophobic chamber. However, in other embodiments, the dry wafer transport system may include only a hooded robotic arm without the hydrophobic chamber or alternatively the hydrophobic chamber without the hooded robotic arm.

The hydrophobic chamber may include a hydrophobic layer configured to prevent liquid droplets from forming along the surface of the hydrophobic chamber. As discussed above, these liquid droplets may fall upon a wafer being transported to and/or from a staging area within the hydrophobic chamber, causing undesirable damage or exposure of the transported wafer (e.g., exposure of the wafer to the liquid cleaning solution outside of the intended use environment of the liquid cleaning solution). In certain embodiments the hydrophobic chamber may include a hydrophobic layer along all ceilings and side walls of the hydrophobic chamber. Accordingly, liquid may not condense and form droplets along the upper and side walls of the hydrophobic chamber. In other embodiments, the hydrophobic layer may be deposited along certain areas of the hydrophobic chamber, such as only or a combination of certain ceilings or side walls of the hydrophobic chamber. A ceiling may refer to an internal surface of the hydrophobic chamber that that is above a lower internal surface of the hydrophobic chamber. Also, a side wall may refer to a surface of the hydrophobic chamber between a ceiling and a lower internal surface of the hydrophobic chamber. In certain embodiments, a hydrophobic layer may be deposited upon an instrument within the hydrophobic chamber. An instrument may be an entire tool or part of a tool utilized for cleaning a wafer. For example, an instrument may include a liquid delivery system which delivers liquid (e.g., a liquid cleaning solution) to a wafer in the performance of wafer cleaning. For example, a hydrophobic layer may be deposited along an instrument in areas in which condensation or liquid may form into droplets that may fall upon a transported wafer.

In various embodiments, a hydrophobic chamber may include a portal which may be opened and closed (e.g., removably sealed) via a door for access to a tool or instrument within the hydrophobic chamber utilized for wafer cleaning. The portal may include a hydrophobic layer along, for example, a ceiling of the portal so that condensation does not form along the ceiling of the portal to drip liquid upon a wafer transported through the portal.

As noted above, the hydrophobic chamber may be configured to clean a wafer. More specifically, the hydrophobic chamber may include a number of instruments which may be operated to clean a wafer deposited or secured within the hydrophobic chamber. Accordingly, an unprocessed wafer (e.g., a wafer that is not yet cleaned) may be brought into the hydrophobic chamber for cleaning and a cleaned wafer (e.g., a wafer that has already undergone a cleaning process) may be removed from the hydrophobic chamber. In order to ensure that the robotic arm that handles the wafer does not sully the wafer that the robotic arm is transporting, a preprocessing robotic arm may bring a wafer into the hydrophobic chamber for cleaning and a different postprocessing robotic arm may remove the cleaned (e.g., processed) wafer from the hydrophobic chamber. Stated another way, the preprocessing robotic arm may be alternatively used with the postprocessing robotic arm when transporting a wafer.

Furthermore, a hood may be utilized with the robotic arm to shield a wafer transported on the robotic arm from a falling droplet of liquid. In certain embodiments both the preprocessing robotic arm and the postprocessing robotic arm may include a hood to shield the wafer transported on the robotic arm from a falling droplet of liquid. However, in other embodiments, only the postprocessing robotic arm that transports a cleaned wafer may include a hood while the preprocessing robotic arm that does not transfer the cleaned wafer (e.g., that transports a preprocessed uncleaned wafer) does not include a hood. In various embodiments, the hood may include a drip edge that extends horizontally from around an extremity of a hood to direct liquid from the hood away from a wafer transported on the hooded robotic arm. The drip edge may be along the extremity (e.g., at an extreme end of the hood) in certain embodiments, or may be offset and next to the extremity but not along the extremity of the hood in other embodiments. Also, the hood may be at least coextensive with a wafer transported on the hooded robotic arm. For example, the hood may be exactly coextensive (e.g., having a same vertical cross sectional area) or may be more than coextensive (e.g., having a greater vertical cross sectional area) than the wafer transported on the hooded robotic arm. The hood may also be sloped (e.g., constructed with a slope or not be level) so as to have liquid drain from the hood along the slope.

Accordingly, a dry wafer transport system that includes both a hooded robotic arm and a hydrophobic chamber may operate the hooded robotic arm to transport a wafer into the hydrophobic chamber using a hooded preprocessing robotic arm and transport the wafer from the hydrophobic chamber using a hooded postprocessing robotic arm. The hooded preprocessing robotic arm may be configured to transport the wafer through a hydrophobic portal that include at least one surface overlaid (e.g., coated) with a hydrophobic layer. Also, the hooded postprocessing robotic arm may also be configured to transport the wafer through the hydrophobic portal that includes at least one surface overlaid with the hydrophobic layer.

In certain embodiments, the hydrophobic layer may be a layer of at least one of polytetrafluoroethylene (PTFE), and perfluoroalkoxy alkanes (PFA). The hydrophobic layer may be deposited in a conventional manner of depositing hydrophobic layers and will not be discussed in detail herein. In various embodiments, a hydrophobic layer may include different materials at different locations, such as PTFE at one location and PFA at another location.

FIG. 1 is a diagram of a dry wafer transport system 100, in accordance with some embodiments. The dry wafer transport system 100 may include a hydrophobic chamber 102 and a hooded robotic arm assembly 104. The hooded robotic arm assembly 104 may include a preprocessing hooded robotic arm 104A and a postprocessing hooded robotic arm 104B. Each of the preprocessing hooded robotic arm 104A and the postprocessing hooded robotic arm 104B may include an respective hood 105A, 105B. The hood 105A, 105B of the hooded robotic arm assembly 104 may be sized to cover a wafer disposed on the hooded robotic arm 104. For example, the hood 105A on a preprocessing hooded robotic arm 104A or the hood 105B on a postprocessing hooded robotic arm 104B may be at least coextensive with a predetermined vertical cross section of a wafer disposed on, or moved by, the hooded robotic arm 104. The hooded robotic arm assembly 104 may include a controller 106, which may control the hooded robotic arm assembly 104 so that the preprocessing hooded robotic arm 104A is alternatively used with the postprocessing hooded robotic arm 104B. For example, the preprocessing hooded robotic arm 104A may be utilized to transport a preprocessed wafer and the postprocessing hooded robotic arm 104B may be utilized to transport a postprocessed wafer or a clean wafer. In certain embodiments, the hood 105A, 105B of a hooded robotic arm may be rigid and made of a liquid impermeable material (e.g., a waterproof material). In other embodiments, the hood 105A, 105B may be flexible with a rigid frame connected by flexible material (e.g., waterproof fabric).

The hooded robotic arm assembly 104 may be operated in conjunction with the hydrophobic chamber 102. The hydrophobic chamber 102 may include at least one hydrophobic layer 110 along a surface of the hydrophobic chamber 102. More specifically, the hydrophobic chamber 102 may include a hydrophobic layer 110 across an interior surface of the hydrophobic chamber 102, such as along a ceiling 112, a side wall 114, a door 116, a portal 118 or across an instrument 120 within the hydrophobic chamber 102. The instrument 120 may be part of a tool or operative component of the hydrophobic chamber 102, such as a liquid delivery system configured to deliver liquid to an upper surface of a wafer 122. The liquid may be dispensed via a nozzle 124 which may have an opening that is not covered by the hydrophobic layer 110 but may be surrounded by the hydrophobic layer 110.

The portal 118 may be configured to be opened and/or closed by the door 116 configured to seal the interior 102A of the hydrophobic chamber 102 from the exterior 102B of the hydrophobic chamber 102. The door 116 may be moved in a vertical direction utilizing a horizontal movement cylinder 130 (e.g., actuator). The door may also be moved in a vertical direction utilizing a vertical movement cylinder 132 (e.g., actuator). Accordingly, the door may be opened and closed via vertical and horizontal movements as actuated by the horizontal movement cylinder 130 and the vertical movement cylinder 132. Each of the horizontal movement cylinder 103 and the vertical movement cylinder 132 are illustrated with dotted lines for ease of illustration to better distinguish from the door 116. Also, the interior 102A of the hydrophobic chamber may be sealed from the exterior 102B of the hydrophobic chamber by utilizing a gasket 139 that interfaces between the door 116 and the sidewall 114 of the hydrophobic chamber 102.

In operation, the wafer 126 may be deposited on a wafer support 140. The wafer may be deposited by the hooded robotic arm assembly 104 moving the wafer over the wafer support 140 and depositing the wafer onto the wafer support 140. For example, the hooded robotic arm assembly 104 may move the wafer 126 over the wafer support 140 and then lower the wafer 126 so that the wafer rests on the wafer support 140 and not the hooded robotic arm assembly 104. This may be accomplished by moving (e.g., lowering) the hooded robotic arm assembly 104 to be within a clearance 142 under the wafer 126. Then, the hooded robotic arm assembly 104 may be retracted out of the hydrophobic chamber 102. Once deposited on the wafer support 140, the wafer support 140 may secure the wafer 126 on the wafer support 140. The wafer may be secured in any of a variety of manners, such as by clamping onto the extremities of the wafer (e.g., an upper surface 126A of the wafer and/or a lower surface 126B of the wafer adjacent to an extreme end 126C of the wafer, and the extreme end 126C of the wafer). Certain embodiments may secure the wafer 126 by clamping onto the extreme end 126C of the wafer and the lower surface 126B of the wafer 126. In various embodiments (not illustrated), the wafer support 140 may secure the wafer 126 on the wafer support 140 by clamping onto both the upper surface 126A and lower surface 126B of the wafer 126 around the extremities of the wafer 126. In certain embodiments, the wafer support 140 may include elastomeric pads on posts to hold the wafer 126 in place by gravity.

The wafer support 140 may be supported (e.g., joined to or connected with) a pedestal 144 which may rotate and cause the wafer support 140 to rotate as well. As will be discussed further below, the wafer support 140 may be intermittent and thus may not completely surround the extremities of the wafer 126 (e.g., may not entirely surround the extreme end 126C of the wafer 126). Also, the wafer 126 held by the wafer support 140 may be parallel to and spaced-apart from the top surface of pedestal. The wafer support 140 can horizontally rotate or spin wafer 108 about its central axis. Additionally, the wafer 126 may be placed face up wherein the side of the wafer with patterns or features such as transistors faces towards the nozzle 124 for spraying liquids (e.g., cleaning chemicals and rinsing water) thereon and the backside of the wafer 126 faces the pedestal 144. In certain embodiments, the pedestal may have a substantially same shape as the wafer 126 and be co-extensive with the entire surface area of the wafer 126.

During cleaning, liquid (e.g., cleaning chemicals and rinsing water) are fed through the nozzle 124 to generate a spray or stream of droplets which form a liquid coating on the upper surface 126A of the wafer 126 while the wafer 126 is spun. Tanks that are part of the instrument 120 may be coupled to a conduit which feeds the nozzle 124. Liquid within the tanks may be utilized to produce the liquid utilized to clean the wafer as ejected from the nozzle 124. The liquid utilized to clean the wafer 126 may include, for example: a piranha solution of sulfuric acid ($H_2SO_4$) and hydrogen peroxide ($H_2O_2$); an ammonia-peroxide mixture (APM) comprising ammonium hydroxide ($NH_4OH$) and water ($H_2O$); a hydrochloric peroxide mixture (HPM) comprising hydrochloric acid (HCl) and hydrogen peroxide ($H_2O_2$); hydrogen fluoride (HF); a ST-250 cleaning solution; ozone ($O_3$) and water ($H_2O$); phosphoric acid ($H_3PO_4$); tetramethylammonium hydroxide (TMAH); $CO_2$ and water ($H_2O$); water ($H_2O$); isopropyl alcohol (IPA); citric acid ($C_6H_8O_7$); nitric acid ($HNO_3$); acetic acid ($CH_3COOH$); a phosphoric acid ($H_3PO_4$), nitric acid ($HNO_3$) and hydrogen fluoride (HF) mixture; and a nitric acid ($HNO_3$), acetic acid ($CH_3OOH$), and phosphoric acid ($H_3PO_4$) mixture.

In particular embodiments, the instrument 120 may be moved vertically (e.g., lowered) so that the nozzle 124 and the nozzle plate 148 (e.g., a part of the instrument 120 with a surface of facing the wafer 126) are closer to the wafer. The nozzle plate 148 may reduce the amount of liquid ejected onto the wafer from the nozzle 124 from splashing along other surfaces (e.g., a ceiling or sidewall) of the hydrophobic chamber 102.

In certain embodiments, the liquid utilized to clean the wafer may also be fed from the pedestal 144 at a lower nozzle 146 to fill the clearance 142 between the pedestal 144 and the wafer 126 to further clean the wafer 126 along the lower surface 126B of the wafer 126. In particular embodiments, the clearance 142 which wafer 108 is held from pedestal 144 by the wafer support 140 can be increased (e.g., by moving either the wafer support 140 or the pedestal 144) to free the lower surface 126B of the wafer 126 from liquid within the clearance 142 to enable the wafer 126 to be rotated at higher speeds. Additionally, a second nozzle (not shown) may be separate from or collocated with nozzle 124 for blowing gas (e.g., $N_2$ gas and/or isopropyl alcohol (IPA) vapor) onto the wafer 126 during rinsing steps.

The wafer 126 may be rinsed using water (e.g., deionized water) after application of a liquid cleaning solution or cleaning chemical. In certain embodiments, the wafer 126 is both exposed to the liquid cleaning solution and the rinsing water (e.g., all liquids ejected by the nozzle 124 and lower nozzle 146) within the hydrophobic chamber (e.g., rinsing is in-situ with the cleaning or etching process).

Figure 2A:
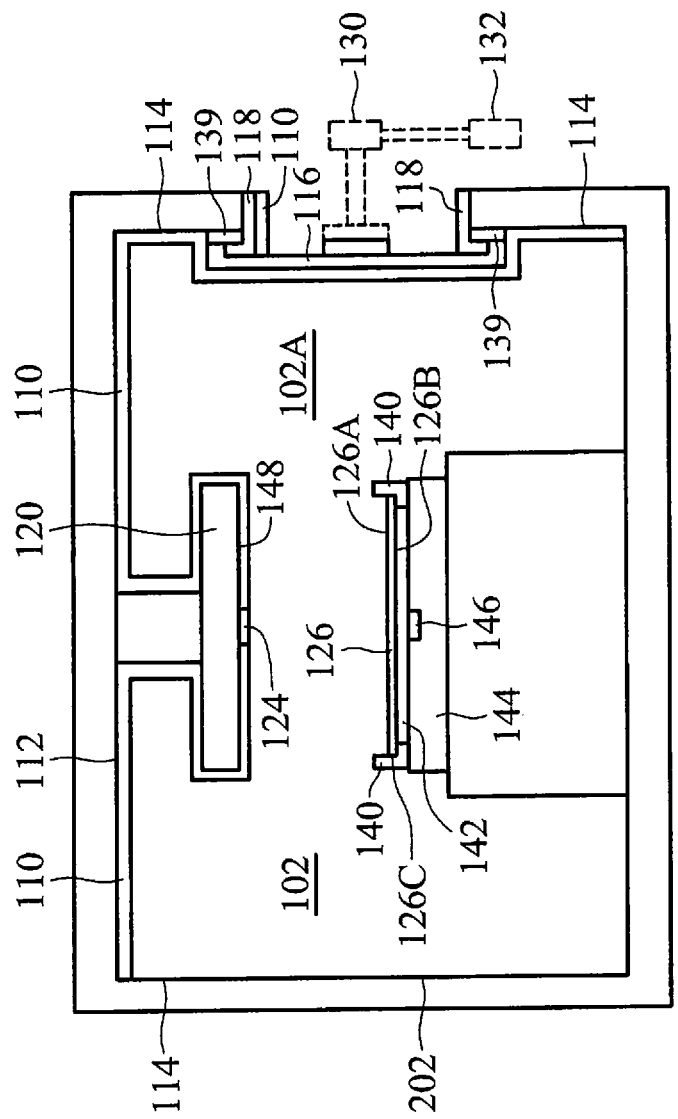
FIG. 2A is a diagram of a hydrophobic chamber without a hydrophobic layer on a back wall, in accordance with some embodiments.

FIG. 2A is a diagram of the hydrophobic chamber 102 without the hydrophobic layer 110 substantially on a back wall 202, in accordance with some embodiments. The back wall 202 may be the sidewall 114 that is opposite the side wall 114 along which the portal 118 is disposed. The hydrophobic layer 110 may be disposed along a portion of the ceiling 112 and also abut the back wall 202 to the extent that it would also abut the ceiling 112. Stated another way, the hydrophobic layer 110 may abut the back wall 202 to a length substantially similar to the width of the hydrophobic layer.

Figure 2B:
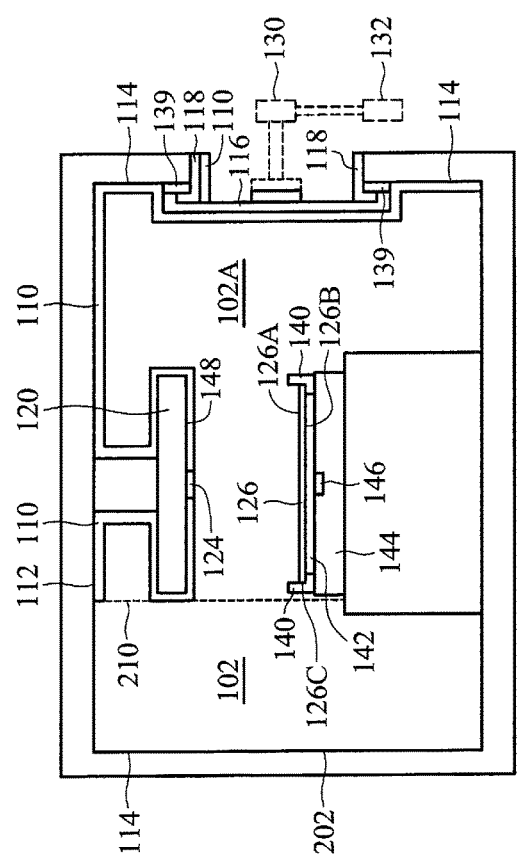
FIG. 2B is a diagram of a hydrophobic chamber with a coextensive hydrophobic layer, in accordance with some embodiments.

FIG. 2B is a diagram of the hydrophobic chamber 102 with a coextensive hydrophobic layer, in accordance with some embodiments. By being coextensive, the hydrophobic layer may extend across the hydrophobic chamber 102 from the portal 118 to the furthest extent 210 of a robotic arm's work envelope (e.g., a work envelope of a hooded robotic arm). As noted above, a robotic arm may be utilized to transport a wafer into and/or out of the hydrophobic chamber 102. The robotic arm may manipulate (e.g., move) a wafer within the robotic arm's work envelope (e.g., a three-dimensional shape that defines the boundaries that the robotic arm can reach). Accordingly, a hydrophobic layer may be applied within the hydrophobic chamber in areas from the portal 118 and up to the furthest extent 210 of the robotic arm's work envelope. Advantageously, this may reduce the amount of unnecessary hydrophobic coating applied within the hydrophobic chamber as hydrophobic coating may not be beyond the furthest extent of the robotic arm's work envelope. The falling of droplets outside of the robotic arm's work envelope may not sully (e.g., make unclean) a cleaned wafer being transported from the hydrophobic chamber 102.

Figure 2C:
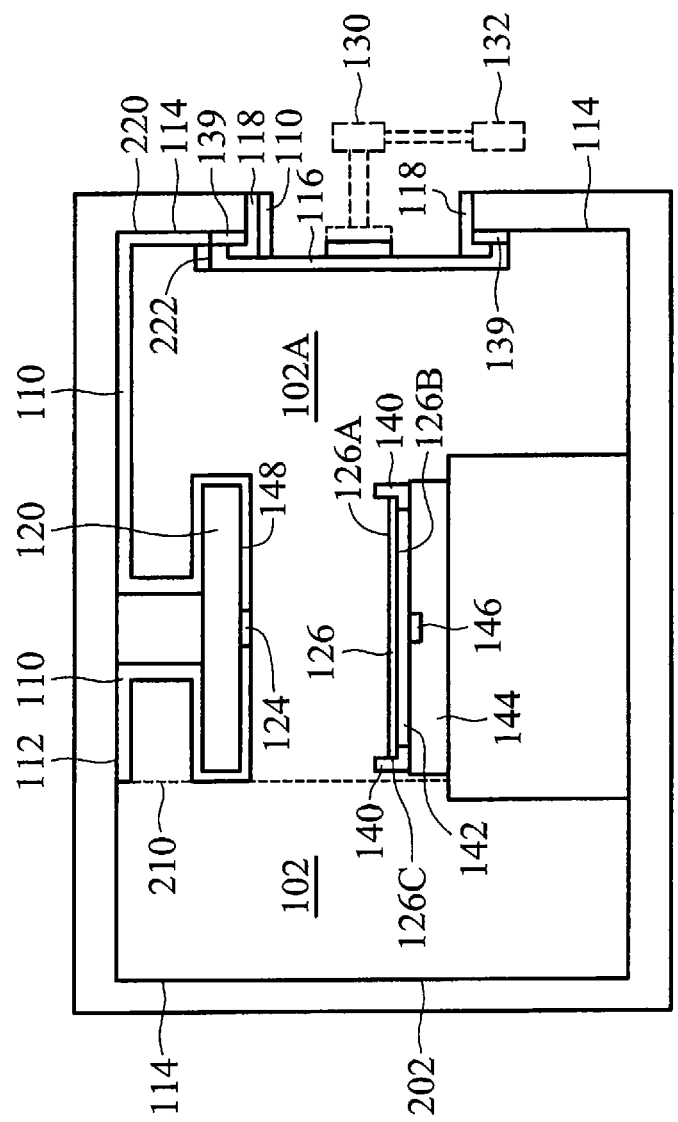
FIG. 2C is a diagram of a hydrophobic chamber with a hydrophobic layer along a portal, front wall, and ceiling, in accordance with some embodiments.

FIG. 2C is a diagram of the hydrophobic chamber 102 with a hydrophobic layer along drip able surfaces, in accordance with some embodiments. The drip able surfaces are the surfaces within a hydrophobic chamber from where liquid may accumulate and drip onto a wafer being transported by a robotic arm within the hydrophobic chamber. Specifically, the drip able surfaces includes the ceiling 112 within the furthest extent 210 of the robotic arm's work envelope, the instrument 120, an upper side wall 220, an upper portion 222 of the door 116, and a ceiling 224 of the portal 118.

Figure 2D:
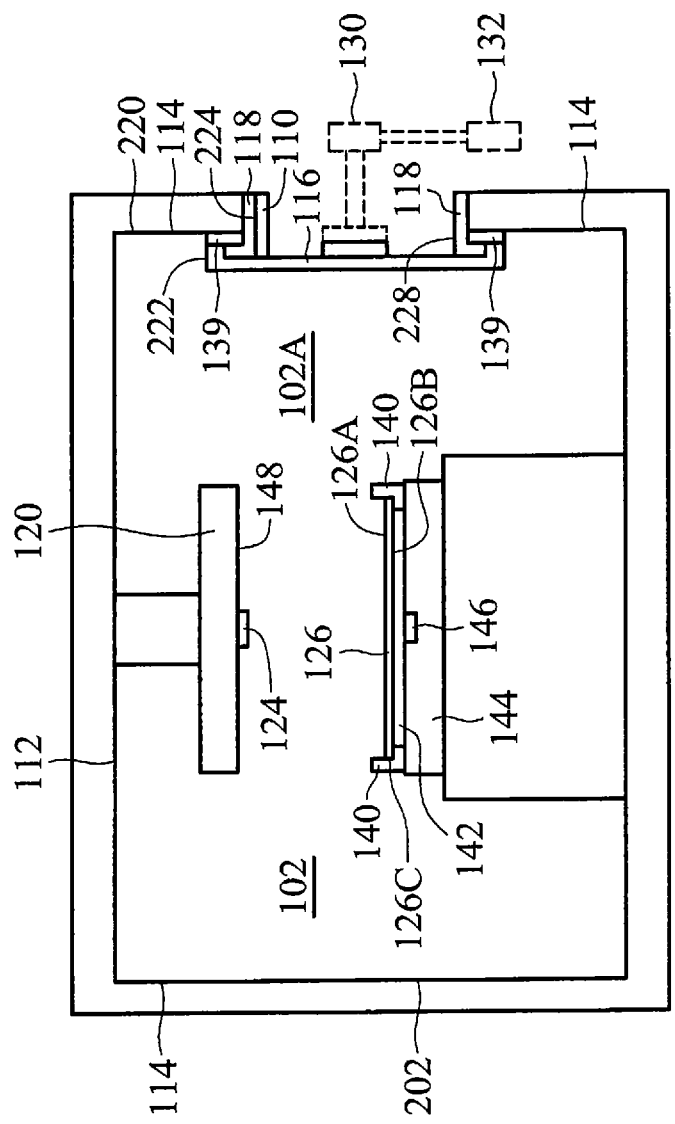
FIG. 2D is a diagram of a hydrophobic chamber with a hydrophobic layer along a portal, in accordance with some embodiments.

FIG. 2D is a diagram of the hydrophobic chamber 102 with the hydrophobic layer 110 along the portal 118, in accordance with some embodiments. More specifically, the hydrophobic layer 110 may be along the ceiling 224 of the portal 118. The ceiling 224 of the portal may be contrasted with a portion of the portal that would not be above a wafer transported by a robotic arm, such as a floor 228 of the portal 118.

Figure 2E:
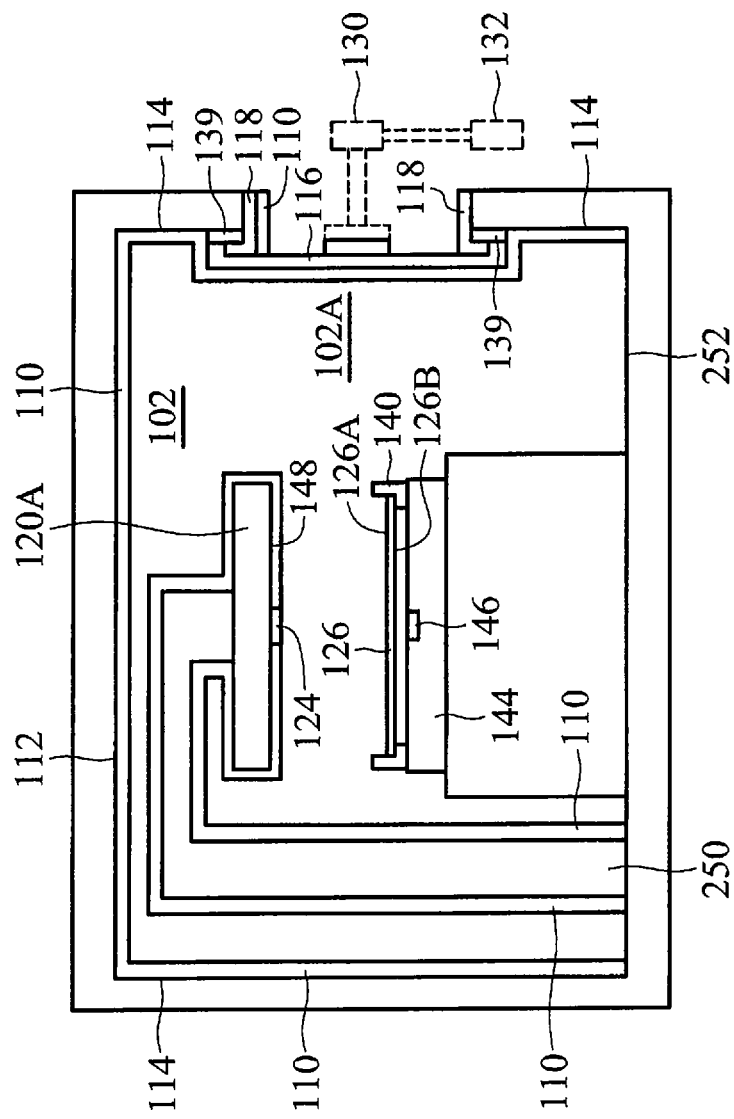
FIG. 2E is a diagram of a hydrophobic chamber with a coextensive hydrophobic layer over a floor supported instrument, in accordance with some embodiments.
Figure 2F:
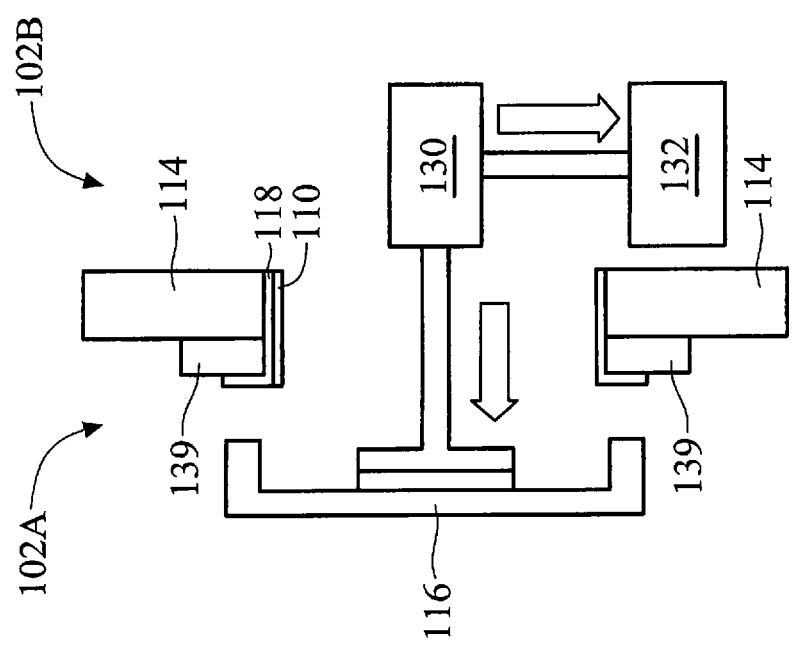
FIG. 2F is a diagram of actuators in a hydrophobic chamber, in accordance with some embodiments.

FIG. 2E is a diagram of the hydrophobic chamber 102 with an instrument 120A supported by a base 250 abutting a floor 252 of the hydrophobic chamber, in accordance with some embodiments. Different than the instrument 120 illustrated in the above referenced figures, the instrument 120A may be supported by the floor 252 rather than the ceiling 112 of the hydrophobic chamber 102. Also, the instrument 120A may include a hydrophobic layer 110 over a surface of the instrument 120A FIG. 2F is a diagram of a door 116 in a process of being opened, in accordance with some embodiments. As introduced above, the portal 118 may be configured to be opened and/or closed by the door 116. The door 116 may be configured to seal the interior 102A of the hydrophobic chamber from the exterior 102B of the hydrophobic chamber. The door 116 may be moved in a vertical direction utilizing a horizontal movement cylinder 130 (e.g., actuator). The door 116 may also be moved in a vertical direction utilizing a vertical movement cylinder 132 (e.g., actuator). Accordingly, the door may be opened and closed via vertical and horizontal movements as actuated by the horizontal movement cylinder 130 and the vertical movement cylinder 132. Also, the interior 102A of the hydrophobic chamber may be sealed from the exterior 102B of the hydrophobic chamber by utilizing a gasket 139 that interfaces between the door 116 and the sidewall 114 of the hydrophobic chamber 102. Also, a hydrophobic layer 110 may be deposited on a ceiling of the portal 118.

Figure 2G:
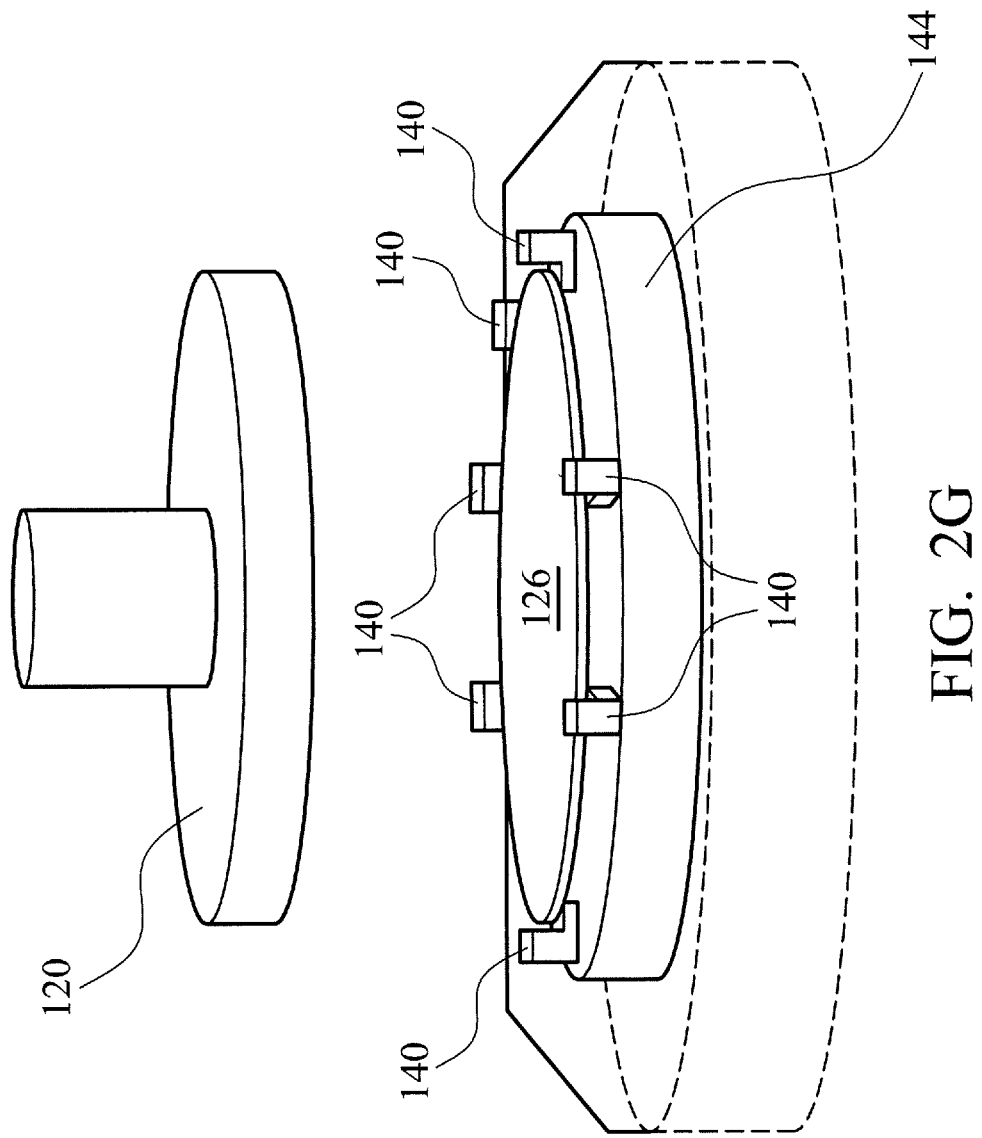
FIG. 2G is a diagram of a wafer support, in accordance with some embodiments.

FIG. 2G is a diagram of a wafer support 140, in accordance with some embodiments. The wafer 126 may be secured on the wafer support 140. The instrument 120 may include a nozzle plate with a surface that faces the wafer 126. The wafer support 140 may be supported (e.g., joined to or connected with) a pedestal 144 which may rotate and cause the wafer support 140 to rotate as well. The wafer support 140 may be intermittent and thus may not completely surround the extremities of the wafer 126 (e.g., may not entirely surround the extreme end of the wafer 126). Also, the wafer 126 held by the wafer support 140 may be parallel to and spaced-apart from the top surface of the pedestal 144.

Figure 3A:
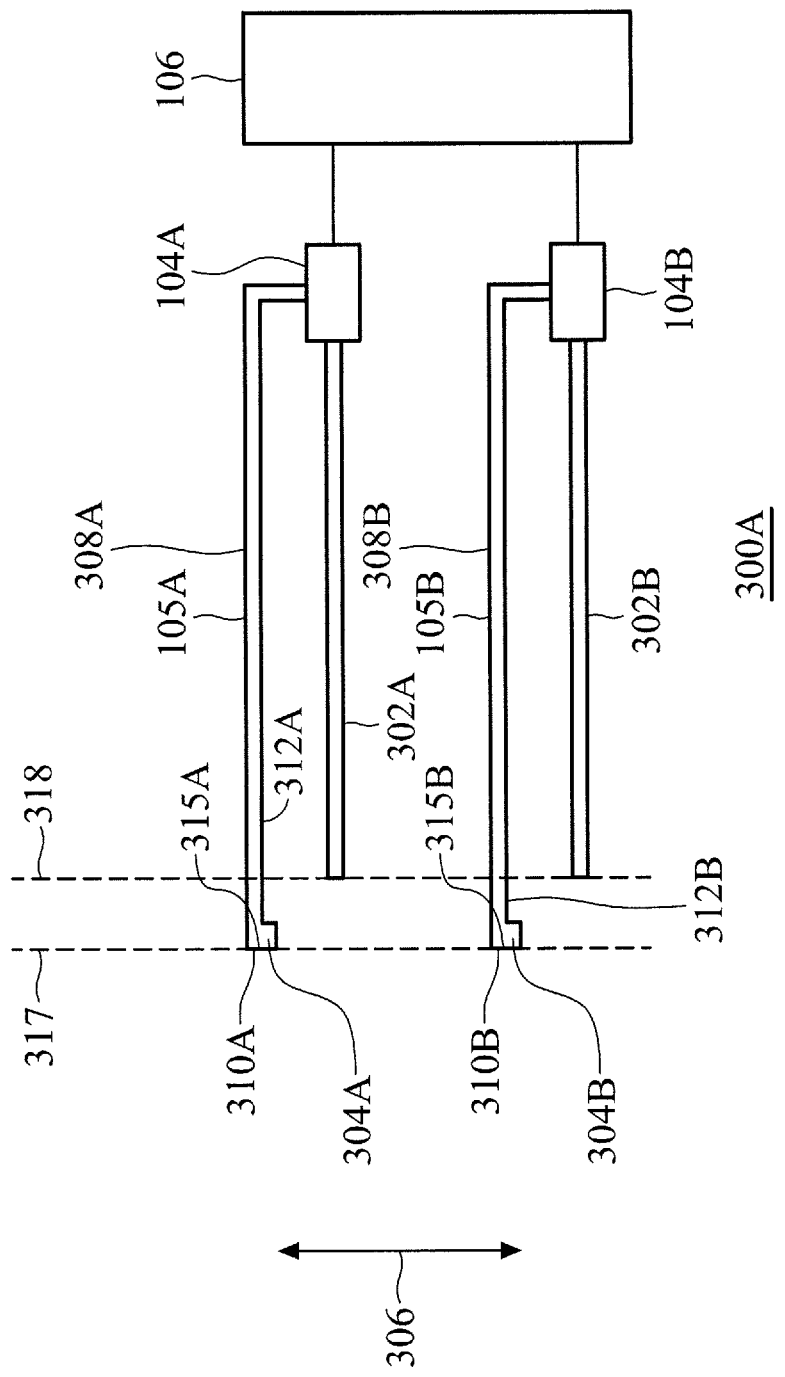
FIG. 3A is a diagram of hooded robotic arms, in accordance with some embodiments.

FIG. 3A is a diagram of a hooded robotic arm assembly 300A, in accordance with some embodiments. As introduced above, the hooded robotic arm assembly 300A may include a preprocessing hooded robotic arm 104A and a postprocessing hooded robotic arm 104B. Each of the preprocessing hooded robotic arm 104A and the postprocessing hooded robotic arm 104B may include an respective hood 105A, 105B. The hood 105A, 105B of the hooded robotic arm assembly 300A may be sized to cover a wafer of a predetermined size and position disposed on the hooded robotic arm 104. For example, the hood 105A on a preprocessing hooded robotic arm 104A or the hood 105B on a postprocessing hooded robotic arm 104B may be at least coextensive with a vertical cross section of a wafer disposed on, or moved by, the hooded robotic arm 104. The hooded robotic arm assembly 300A may include a controller 106, which may control the hooded robotic arm assembly 300A so that the preprocessing hooded robotic arm 104A is alternatively used with the postprocessing hooded robotic arm 104B. For example, the preprocessing hooded robotic arm 104A may be utilized to transport a preprocessed or uncleaned wafer and the postprocessing hooded robotic arm 104B may be utilized to transport a postprocessed or clean wafer. In certain embodiments, the hood 105A, 105B of a hooded robotic arm may be rigid and made of a water impermeable material (e.g., a waterproof material). In other embodiments, the hood 105A, 105B may be flexible with a rigid frame connected by flexible material (e.g., waterproof fabric).

The hooded robotic arm assembly 300A may include a programmable mechanical arm to grasp, hold, and manipulate objects (e.g., a wafer). The hooded robotic arm assembly 300A may include a gripper hand 302A, 302B. Each of the preprocessing hooded robotic arm 104A and the postprocessing hooded robotic arm 104B may have a respective gripper hand 302A, 302B. The gripper hand 302A, 302B may include any type of effector used for grasping or holding an object, such as a wafer, by the robotic arm 104. For example, the effector may be a pressure gripper (e.g., gripping by applying pressure to an object, such as with a pincer type motion), an envelope gripper (e.g., gripping by surrounding an object to be manipulated), a vacuum gripper (e.g., gripping by suction force), and a magnetic gripper (e.g., gripping by use of electromagnetic forces). In certain embodiments, the gripper hand 302A, 302B may utilize at least two fingers, with one opposing the other. The multiple fingers may be utilized to apply pressure as a pressure gripper and or as an envelope gripper. In certain embodiments, the gripper hand 302A for the preprocessing hooded robotic arm 104A may be different than the gripper hand 302B for the postprocessing hooded robotic arm 104B. For example, the gripper hand 302A for the preprocessing hooded robotic arm 104A may have three fingers and the gripper hand 302B for the postprocessing hooded robotic arm 104B may have two fingers.

The hoods 105A, 105B of the hooded robotic arm assembly 300A may include a drip edge 304A, 304B. The drip edge 304A, 304B may be an extension of a hood 105A, 105B that substantially extends in a vertical direction (e.g., along a vertical axis 306) and is thicker along the vertical direction than other portions of the hood 105A, 105B. More specifically, the drip edge 304A, 304B may be material that guides liquid dripping from a top 308A, 308B of the hood or a side 310A, 310B of the hood so that the dripping liquid is directed away from and not toward a wafer that rests on a gripper hand of the hooded robotic arm assembly 300A. For example, liquid may accumulate along the top 308A, 308B and drip or fall due to gravity along the side 310A, 310B of a hood. With the drip edge, the dripping liquid would not move from the side 310A, 310B of the hood into an underside 312A, 312B of the hood. As illustrated in FIG. 3A, the drip edge 304A, 304B is along an extreme end 315A, 315B of a respective hood 105A, 105B. Also, the extent 317 of an extreme end 315A, 315B of a hood 105A, 105B may extend beyond a corresponding extent 318 of an extreme end of a respective gripper hand 302A, 302B.

Figure 3B:
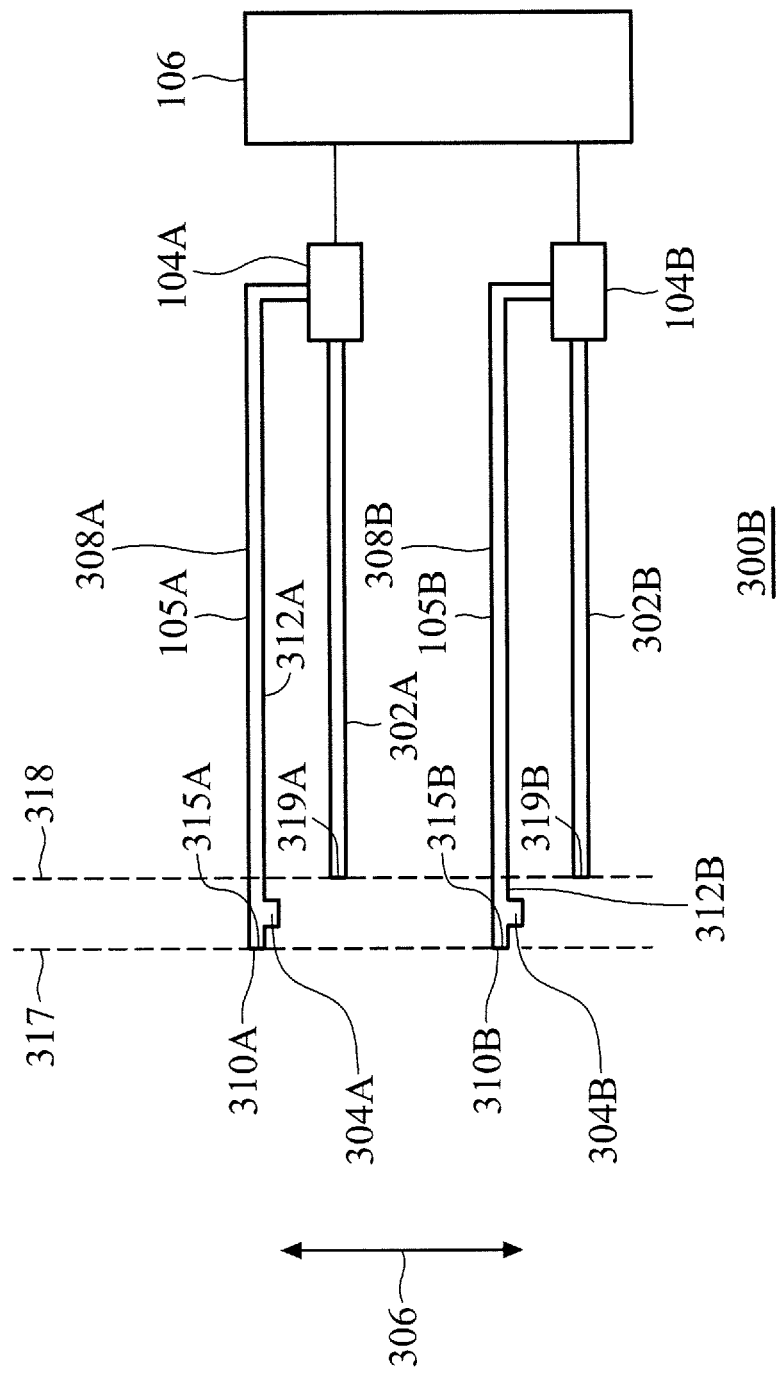
FIG. 3B is a diagram of hooded robotic arms with an offset drip edge, in accordance with some embodiments.

FIG. 3B is a diagram of a hooded robotic arm assembly 300B with an offset drip edge 322A, 322B, in accordance with some embodiments. Different than the drip edges 304A, 304B of the hooded robotic arm assembly 300A FIG. 3A, the offset drip edges 322A, 322B of the hooded robotic arm assembly 300B FIG. 3B may not be at an extreme end 315A, 315B of a hood 105A, 105B. Rather, there may be a distance or clearance between the extreme end 315A, 315B of a hood 105A, 105B and the offset drip edge 322A, 322B.

Figure 3C:
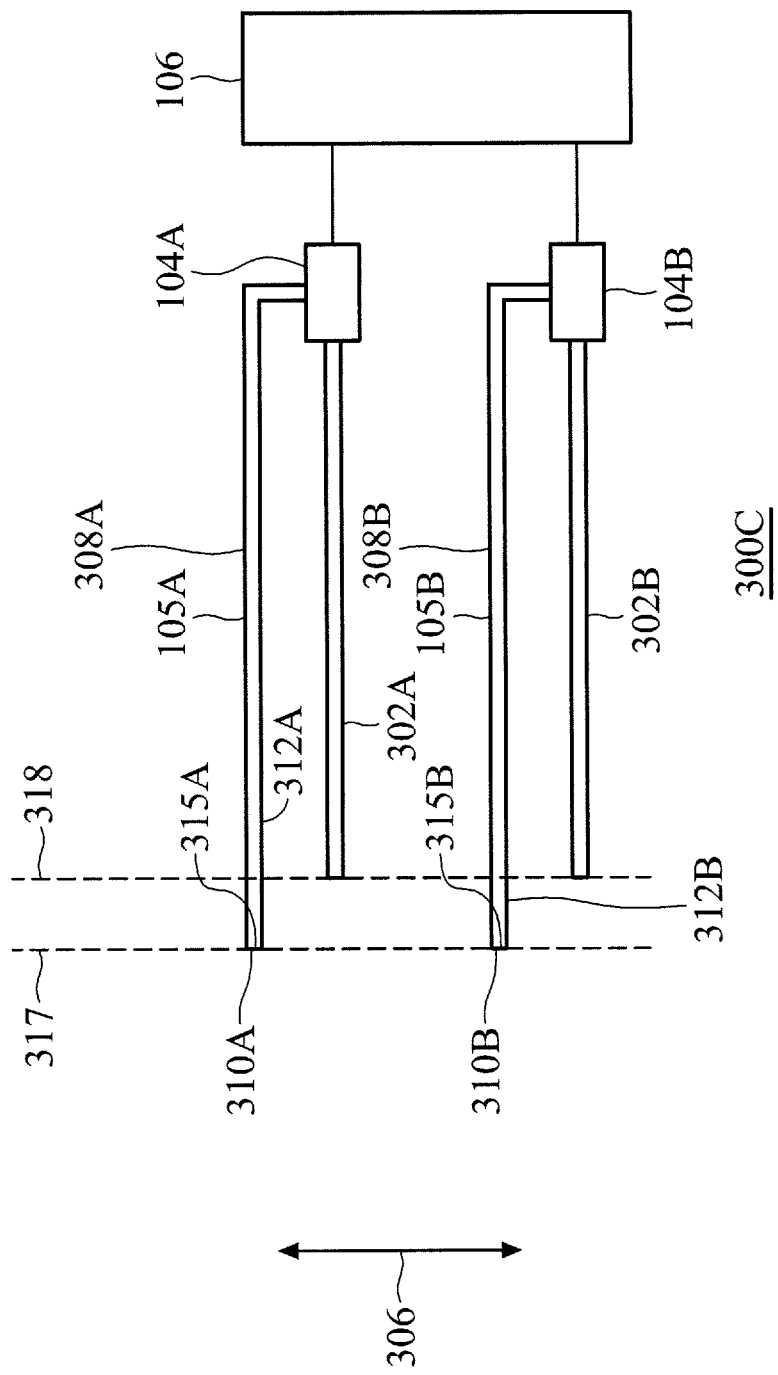
FIG. 3C is a diagram of hooded robotic arms without a drip edge, in accordance with some embodiments.

FIG. 3C is a diagram of a hooded robotic arm assembly 300C without a drip edge, in accordance with some embodiments. Different than the hooded robotic arm assemblies discussed above, the hooded robotic arms assembly 300C of FIG. 3C may not have a drip edge. Rather, there is no extension of a hood 105A, 105B that extends in a vertical direction (e.g., along a vertical axis 306) to be thicker along the vertical direction near the extreme end 315A, 315B of a hood 105A, 105B than other portions of the hood 105A, 105B.

Figure 3D:
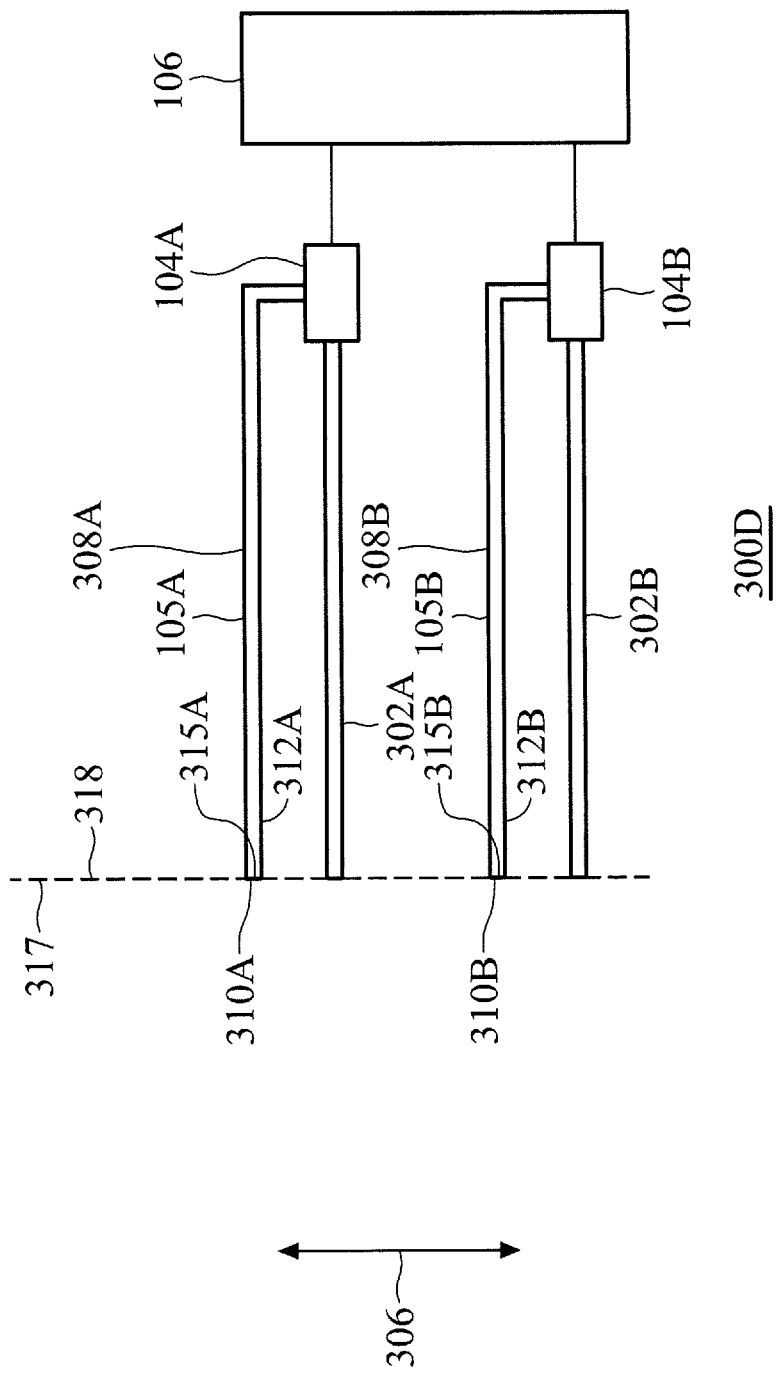
FIG. 3D is a diagram of hooded robotic arms with wafer fiducials, in accordance with some embodiments.

FIG. 3D is a diagram of a hooded robotic arm assembly 300D where the extreme ends of the hood and gripper hand have the same extent, in accordance with some embodiments. As illustrated, the extent 317 of an extreme end 315A, 315B of a hood 105A, 105B is the same as a corresponding extent 318 of an extreme end of a respective gripper hand 302A, 302B. In certain embodiments, it may be advantageous to reduce the amount of space occupied by a hood and thus have extreme ends of the hood and gripper hand have the same extent. In various embodiments, a hooded robotic arm assembly 300D where the extreme ends of the hood and gripper hand have the same extent may also have a drip edge, as discussed above.

Figure 3E:
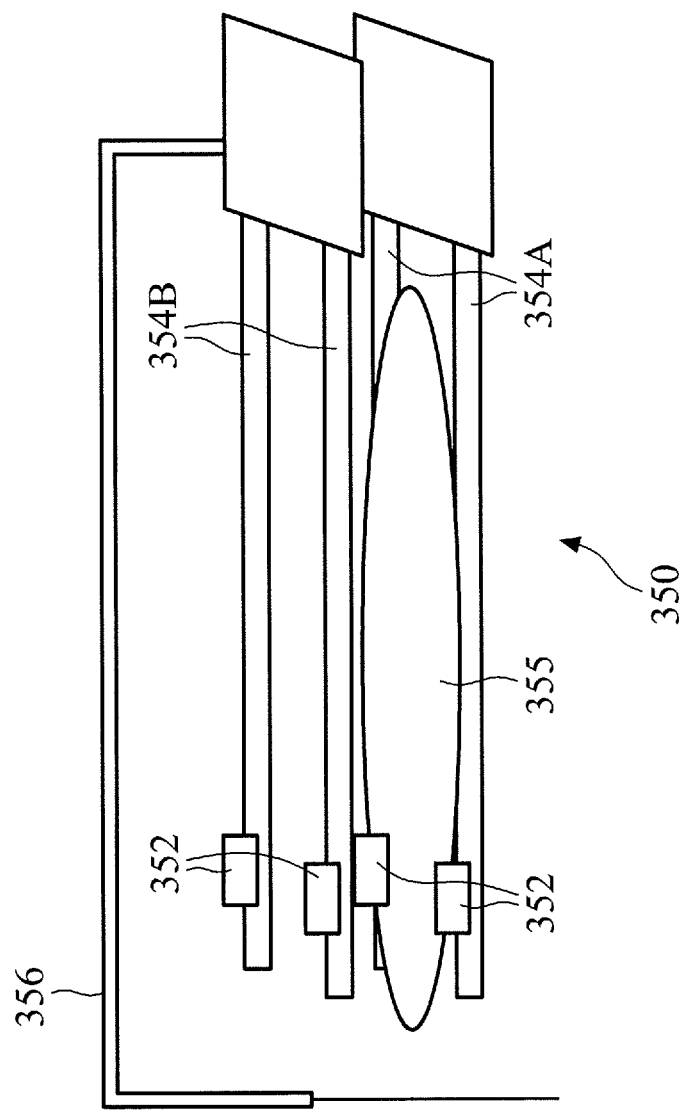
FIG. 3E is a diagram of a hooded robotic arm assembly with wafer fiducials, in accordance with some embodiments.

FIG. 3E is a diagram of a hooded robotic arm assembly 350 with wafer fiducials 352, in accordance with some embodiments. The wafer fiducials 352 may be a feature or landmark on a gripper hand 354A, 354B to indicate where a wafer 355 should be grasped or handled using the gripper hand 354. Also, for ease of illustration, only one hood 356 is illustrated but each of the gripper hands 354A, 354B may have its own respective hood, as discussed further above.

Figure 4:
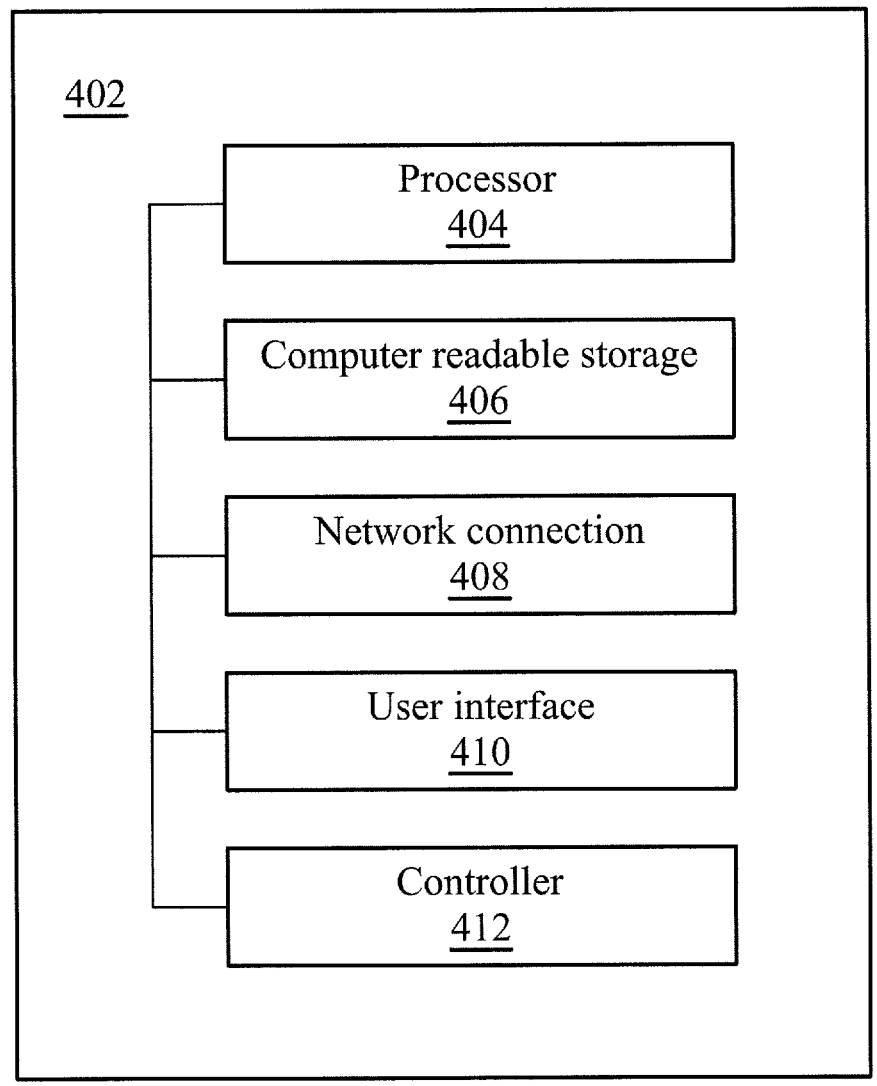
FIG. 4 is a block diagram of various functional modules of a dry wafer transport system, in accordance with some embodiment.

FIG. 4 is a block diagram of various functional modules of a dry wafer transport system 402, in accordance with some embodiment. These functional modules may be present in addition to the various features of a dry wafer transport system discussed above. The dry wafer transport system 402 may include a processor 404. In further embodiments, the processor 404 may be implemented as one or more processors.

The processor 404 may be operatively connected to a computer readable storage 406 (e.g., a memory and/or data store), a network connection 408, a user interface 410, and a controller 412. In some embodiments, the computer readable storage 406 may include process logic that may configure the processor 404 to perform the various processes discussed herein. The computer readable storage may also store data, such as identifiers for a wafer, identifiers for a robotic arm, identifiers for a gripper hand, identifiers for a cleaning or processing routine for performance within a hydrophobic chamber, and any other parameter or information that may be utilized to perform the various processes discussed herein.

The network connection 408 may facilitate a network connection of the workstation with various devices and/or components of the workstation that may communicate within or external to the dry wafer transport system 402. In certain embodiments, the network connection 408 may facilitate a physical connection, such as a line or a bus. In other embodiments, the network connection 408 may facilitate a wireless connection, such as over a wireless local area network (WLAN) by using a transmitter, receiver, and/or transceiver. For example, the network connection module 408 may facilitate a wireless or wired connection with the processor 404 and the controller 412.

The dry wafer transport system 402 may also include a user interface 410. The user interface may include any type of interface for input and/or output to an operator of the workstation, including, but not limited to, a monitor, a laptop computer, a tablet, or a mobile device, etc.

The dry wafer transport system 402 may include a controller 412. The controller 106 (discussed above) may be part of the controller 412 of FIG. 4. The controller 412 may be configured to control various physical apparatuses that control movement or functionality of the dry wafer transport system 402, such as for a robotic arm, a cylinder, a nozzle and/or a wafer support. For example, the controller 412 may control a motor that may move a robotic arm, a cylinder, a nozzle and/or a wafer support. The controller may be controlled by the processor and may carry out the various aspects of the various processes discussed herein.

Figure 5:
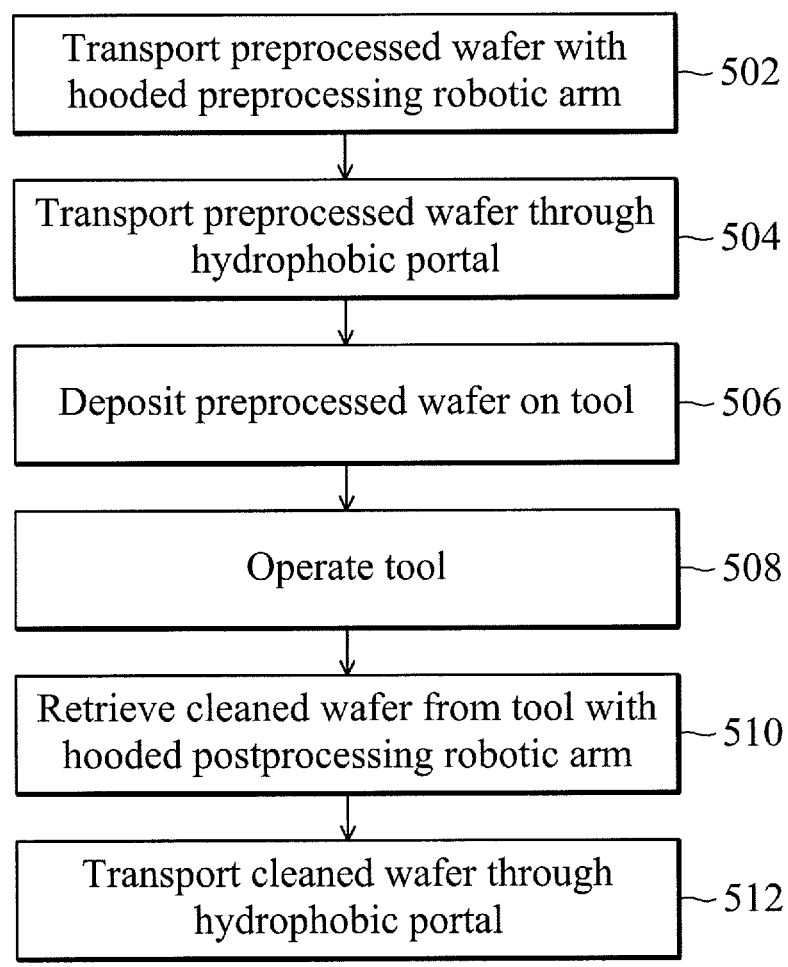
FIG. 5 is a flow chart of a dry wafer transport process, in accordance with some embodiments.

FIG. 5 is a flow chart of a dry wafer transport process 500, in accordance with some embodiments. The dry wafer transport process 500 may be performed by a dry wafer transport system, as introduced above. It is noted that the process 500 is merely an example, and is not intended to limit the present disclosure. Accordingly, it is understood that additional operations may be provided before, during, and after the process 500 of FIG. 5, certain operations may be omitted, certain operations may be performed concurrently with other operations, and that some other operations may only be briefly described herein.

At operation 502, a preprocessed (e.g., uncleaned) wafer may be transported by a hooded preprocessing robotic arm. As noted above, an unprocessed wafer (e.g., a wafer that has not yet been cleaned) may be brought into a hydrophobic chamber for cleaning and a cleaned wafer (e.g., a wafer that has already undergone a cleaning process) may be removed from the hydrophobic chamber. In order to ensure that the robotic arm that handles the wafer does not sully the wafer that the robotic arm is transporting, a preprocessing robotic arm (e.g., a first robotic arm) may bring a wafer into the hydrophobic chamber for cleaning and a different postprocessing robotic arm (e.g., a second robotic arm different than the first robotic arm) may remove the cleaned (e.g., processed) wafer from the hydrophobic chamber. Stated another way, the preprocessing robotic arm may be alternatively used with the postprocessing robotic arm when transporting a wafer. Furthermore, a hood may be utilized with the robotic arm (e.g., either the preprocessing robotic arm and/or the postprocessing robotic arm) to shield the wafer transported on the robotic arm from a falling droplet of liquid.

At operation 504, the unprocessed wafer may be transported by the hooded preprocessing robotic arm through a hydrophobic portal. The hydrophobic portal may refer to a portal, to access a hydrophobic chamber, with a hydrophobic layer. The hydrophobic layer may be, for example, along a ceiling of the portal so that condensation does not form along the ceiling of the portal to drip liquid upon a wafer transported through the portal. The hydrophobic portal may be opened and closed via a door for access to a tool within the hydrophobic chamber utilized for wafer cleaning.

At operation 506, the unprocessed (e.g., uncleaned) wafer may be deposited on a wafer support to interact with a cleaning tool. The wafer may be deposited by the hooded preprocessing robotic arm moving the wafer over a wafer support and depositing the wafer onto the wafer support. For example, the hooded preprocessing robotic arm may move the wafer over the wafer support and then lower the wafer so that the wafer rests on the wafer support and not the hooded preprocessing robotic arm. This may be accomplished by moving the hooded preprocessing robotic arm within a clearance under the wafer and then retracting out of the hydrophobic chamber. The wafer may be secured on the wafer support once deposited on the wafer support. The wafer may be secured in any of a variety of manners, such as by clamping onto the extremities of the wafer. Certain embodiments may secure the wafer by clamping onto the extreme end of the wafer and the lower surface of the wafer.

At operation 508 the cleaning tool may be operated to clean the wafer. As introduced above, the cleaning tool may include various instruments within the hydrophobic chamber to clean the wafer. The wafer support may be supported (e.g., joined to or connected with) a pedestal which may rotate and cause the wafer support to rotate as well. The wafer held by the wafer support may be parallel to and spaced-apart from the top surface of pedestal (e.g., have clearance under the wafer). The wafer support can horizontally rotate or spin the wafer about its central axis. Additionally, the wafer may be placed face up so that the side of the wafer with patterns or features such as transistors faces towards a nozzle for spraying cleaning chemicals thereon and the backside of the wafer faces the pedestal.

During cleaning, liquid (e.g., cleaning chemicals and rinsing water) are fed through the nozzle to generate a spray of droplets which form a liquid coating on the upper surface of the wafer while the wafer is spun. Tanks that are part of the instrument utilized for cleaning the wafer may be coupled to a conduit which feeds the nozzle. Liquid within the tanks may be utilized to produce the liquid utilized to clean the wafer as ejected from the nozzle.

The wafer 126 may be rinsed using water (e.g., deionized water) after application of a liquid cleaning solution or cleaning chemical. In certain embodiments, the wafer is both exposed to the liquid cleaning solution and the rinsing water within the hydrophobic chamber.

At operation 510, the cleaned (e.g., the processed) wafer may be retrieved from the tool using the hooded postprocessing robotic arm. For example, the hooded postprocessing robotic arm may move its gripper hand under the wafer within the clearance between the wafer and the underlying pedestal and lift the wafer up over the pedestal and retract out of the hydrophobic chamber. In certain embodiments, the wafer is unlocked (e.g., unsecured) from being actively gripped or secured by the wafer support before the hooded postprocessing robotic arm moves the wafer.

At operation 512, the cleaned wafer may be transported by the hooded postprocessing robotic arm through a hydrophobic portal. By transporting through the hydrophobic portal, the hooded postprocessing robotic arm may transport the cleaned wafer from the hydrophobic chamber.

In an embodiment, a system includes: a first robotic arm configured to transport a wafer into a cleaning chamber, wherein the first robotic arm comprises a first hood that substantially covers the wafer when transported on the first robotic arm; the cleaning chamber configured to clean the wafer; a second robotic arm configured to transport the wafer out of the cleaning chamber, wherein the second robotic arm comprises a second hood that substantially covers the wafer when transported on the second robotic arm, wherein the second robotic arm is different than the first robotic arm.

In another embodiment, a system includes: a cleaning chamber comprising a portal through which a wafer may be passed between an interior of the cleaning chamber and an exterior of the cleaning chamber, wherein the portal is coated with a hydrophobic layer, a first robotic arm configured to transport the wafer into the cleaning chamber through the portal; a second robotic arm configured to transport the wafer out of the cleaning chamber through the portal, wherein the second robotic arm is different than the first robotic arm.

In another embodiment, a method includes: transporting a wafer with a first robotic arm through a portal into a cleaning chamber, wherein: the first robotic arm comprises a first hood that substantially covers the wafer when transported on the first robotic arm, and the portal comprises a surface coated with a hydrophobic layer; cleaning the wafer within the cleaning chamber; and transporting the wafer with a second robotic arm through the portal out of the cleaning chamber, wherein the second robotic arm comprises a second hood that substantially covers the wafer when transported on the second robotic arm.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

In this document, the term "module" as used herein, refers to software, firmware, hardware, and any combination of these elements for performing the associated functions described herein. Additionally, for purpose of discussion, the various modules are described as discrete modules; however, as would be apparent to one of ordinary skill in the art, two or more modules may be combined to form a single module that performs the associated functions according embodiments of the invention.

A person of ordinary skill in the art would further appreciate that any of the various illustrative logical blocks, modules, processors, means, circuits, methods and functions described in connection with the aspects disclosed herein can be implemented by electronic hardware (e.g., a digital implementation, an analog implementation, or a combination of the two), firmware, various forms of program or design code incorporating instructions (which can be referred to herein, for convenience, as "software" or a "software module), or any combination of these techniques. To clearly illustrate this interchangeability of hardware, firmware and software, various illustrative components, blocks, modules, circuits, and steps have been described above generally in terms of their functionality. Whether such functionality is implemented as hardware, firmware or software, or a combination of these techniques, depends upon the particular application and design constraints imposed on the overall system. Skilled artisans can implement the described functionality in various ways for each particular application, but such implementation decisions do not cause a departure from the scope of the present disclosure.

Furthermore, a person of ordinary skill in the art would understand that various illustrative logical blocks, modules, devices, components and circuits described herein can be implemented within or performed by an integrated circuit (IC) that can include a general purpose processor, a digital signal processor (DSP), an application specific integrated circuit (ASIC), a field programmable gate array (FPGA) or other programmable logic device, or any combination thereof. The logical blocks, modules, and circuits can further include antennas and/or transceivers to communicate with various components within the network or within the device. A general purpose processor can be a microprocessor, but in the alternative, the processor can be any conventional processor, controller, or state machine. A processor can also be implemented as a combination of computing devices, e.g., a combination of a DSP and a microprocessor, a plurality of microprocessors, one or more microprocessors in conjunction with a DSP core, or any other suitable configuration to perform the functions described herein.

Conditional language such as, among others, "can," "could," "might" or "may," unless specifically stated otherwise, are otherwise understood within the context as used in general to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Additionally, persons of skill in the art would be enabled to configure functional entities to perform the operations described herein after reading the present disclosure. The term "configured" as used herein with respect to a specified operation or function refers to a system, device, component, circuit, structure, machine, etc. that is physically or virtually constructed, programmed and/or arranged to perform the specified operation or function.

Disjunctive language such as the phrase "at least one of X, Y, or Z," unless specifically stated otherwise, is otherwise understood with the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present.

It should be emphasized that many variations and modifications may be made to the above-described embodiments, the elements of which are to be understood as being among other acceptable examples. All such modifications and variations are intended to be included herein within the scope of this disclosure and protected by the following claims.

What is claimed is:

1. A system, comprising:
a cleaning chamber configured to clean a wafer, the cleaning chamber comprising a plurality of side walls, a ceiling and a floor that enclose the wafer during a cleaning process;
a first robotic arm configured to transport the wafer into the cleaning chamber, wherein the first robotic arm comprises a first hood that covers the wafer when transported on the first robotic arm and a first gripper hand configured to hold the wafer during transport into the cleaning chamber; and
a second robotic arm configured to transport the wafer out of the cleaning chamber, wherein the second robotic arm comprises a second hood that covers the wafer when transported on the second robotic arm and a second gripper hand configured to hold the wafer during transport out of the cleaning chamber, wherein the second robotic arm is different than the first robotic arm,
wherein the first hood comprises a first drip edge that extends vertically downward from an edge portion of the first hood such that the first drip edge is thicker in a vertical direction than other portions of the first hood, and wherein the first drip edge extends horizontally past an edge of the first gripper hand such that there is a clearance between the first drip edge and the edge of the first gripper hand while the wafer is being transported into the cleaning chamber, and
wherein the first drip edge is fixed and integral with respect to the first hood, and wherein the second hood comprises a second drip edge that extends vertically downward from an edge portion of the second hood such that the second drip edge is thicker in a vertical direction than other portions of the second hood, and wherein the second drip edge extends horizontally past an edge of the second gripper hand such that there is a clearance between the second drip edge and the edge of the second gripper hand while the wafer is being transported out of the cleaning chamber, and wherein the second drip edge is fixed and integral with respect to the second hood.

2. The system of claim 1, wherein the first hood comprises a slope configured to drain liquid from the first hood along the slope.

3. The system of claim 1, wherein the first hood comprises a greater cross sectional area than the wafer.

4. The system of claim 1, wherein the first drip edge is offset from an outermost portion of the edge portion of the first hood and the second drip edge is offset from an outermost portion of the edge portion of the second hood.

5. The system of claim 1, wherein the cleaning chamber comprises a nozzle plate disposed over the wafer while the wafer is secured in the cleaning chamber, wherein the nozzle plate is coated with a hydrophobic layer along a surface configured to face the wafer.

6. The system of claim 1, further comprising:
a wafer support configured to secure the wafer within the cleaning chamber; and
a pedestal configured to spin the wafer support; and
a nozzle configured to apply a liquid to the wafer while the wafer is spun.

7. The system of claim 6, wherein the liquid comprises at least one of:
a piranha solution of sulfuric acid ($H_2SO_4$) and hydrogen peroxide ($H_2O_2$);
an ammonia-peroxide mixture (APM) comprising ammonium hydroxide ($NH_4OH$) and water ($H_2O$);
a hydrochloric peroxide mixture (HPM) comprising hydrochloric acid (HCl) and hydrogen peroxide ($H_2O_2$);
hydrogen fluoride (HF);
a ST-250 cleaning solution;
ozone ($O_3$) and water ($H_2O$);
phosphoric acid ($H_3PO_4$);
tetramethylammonium hydroxide (TMAH);
$CO_2$ and water ($H_2O$);
water ($H_2O$);
isopropyl alcohol (WA);
citric acid ($C_6H_8O_7$);
nitric acid ($HNO_3$);
acetic acid ($CH_3COOH$);
a phosphoric acid ($H_3PO_4$), nitric acid ($HNO_3$) and hydrogen fluoride (HF) mixture; and
a nitric acid ($HNO_3$), acetic acid ($CH_3OOH$), and phosphoric acid ($H_3PO_4$) mixture.

8. The system of claim 1, wherein the cleaning chamber comprises a portal through which the wafer may be passed between an interior of the cleaning chamber and an exterior of the cleaning chamber, wherein the portal is coated with a hydrophobic layer.

9. The system of claim 8, wherein the portal is configured to be removably sealed with a door and a surface of the door facing the interior of the cleaning chamber is coated with the hydrophobic layer.

10. The system of claim 1, wherein the ceiling of the cleaning chamber is coated with a hydrophobic layer.

11. The system of claim 10, wherein the hydrophobic layer comprises at least one of:
polytetrafluoroethylene (PTFE), and
perfluoroalkoxy alkanes (PFA).

12. A system, comprising:
a cleaning chamber configured to contain and clean a wafer during a cleaning process, the cleaning chamber comprising a plurality of side walls, a ceiling and a floor that enclose the wafer during the cleaning process, wherein at least the ceiling of the cleaning chamber is coated with a hydrophobic layer;
a first robotic arm configured to transport the wafer into the cleaning chamber, wherein the first robotic arm comprises a first hood that covers the wafer when transported on the first robotic arm and a first gripper hand configured to hold the wafer during transport into the cleaning chamber;
a second robotic arm configured to transport the wafer out of the cleaning chamber, wherein the second robotic arm comprises a second hood that covers the wafer when transported on the second robotic arm and a second gripper hand configured to hold the wafer during transport out of the cleaning chamber, wherein the second robotic arm is different than the first robotic arm,
wherein the first hood comprises a first drip edge that extends vertically downward from an edge portion of the first hood such that the first drip edge is thicker in a vertical direction than other portions of the first hood, and wherein the first drip edge extends horizontally past an edge of the first gripper hand such that there is a clearance between the first drip edge and the edge of the first gripper hand while the wafer is being transported into the cleaning chamber, and wherein the first drip edge is fixed and integral with respect to the first hood, and
wherein the second hood comprises a second drip edge that extends vertically downward from an edge portion of the second hood such that the second drip edge is thicker in a vertical direction than other portions of the second hood, and wherein the second drip edge extends horizontally past an edge of the second gripper hand such that there is a clearance between the second drip edge and the edge of the second gripper hand while the wafer is being transported out of the cleaning chamber, and wherein the second drip edge is fixed and integral with respect to the second hood; and
a controller coupled to each of the first and second robotic arms and configured to simultaneously move both the first gripper hand and the first hood when transporting the wafer into the cleaning chamber, and simultaneously move both the second gripper hand and the second hood when transporting the wafer out of the cleaning chamber.

13. The system of claim 12, wherein the first hood comprises a slope configured to drain liquid from the first hood along the slope.

14. The system of claim 12, wherein a top surface of the first hood has a greater area than a top surface of the wafer.

15. The system of claim 12, wherein the first drip edge is offset from an outermost portion of the edge portion of the first hood and the second drip edge is offset from an outermost portion of the edge portion of the second hood.

16. The system of claim 12, wherein the cleaning chamber comprises a nozzle plate disposed over the wafer while the wafer is secured in the cleaning chamber, wherein the nozzle plate is coated with a hydrophobic layer along a surface configured to face the wafer.

17. The system of claim 12, wherein the cleaning chamber comprises:
a wafer support configured to secure the wafer within the cleaning chamber;
a pedestal configured to spin the wafer support; and
a nozzle configured to apply a liquid to the wafer while the wafer is spun.

18. A system, comprising:
a cleaning chamber configured to contain and clean a wafer during a cleaning process, the cleaning chamber comprising a plurality of side walls, a ceiling and a floor that enclose the wafer during the cleaning process, wherein at least the ceiling of the cleaning chamber is coated with a hydrophobic layer;

a first robotic arm configured to transport the wafer into the cleaning chamber, wherein the first robotic arm comprises a first hood that covers the wafer when transported on the first robotic arm and a first gripper hand configured to hold the wafer during transport into the cleaning chamber;

a second robotic arm configured to transport the wafer out of the cleaning chamber, wherein the second robotic arm comprises a second hood that covers the wafer when transported on the second robotic arm and a second gripper hand configured to hold the wafer during transport out of the cleaning chamber, wherein the second robotic arm is different than the first robotic arm, wherein the first hood comprises a first drip edge that extends vertically downward from an edge portion of the first hood such that the first drip edge is thicker in a vertical direction than other portions of the first hood, and wherein the first drip edge extends horizontally past an edge of the first gripper hand such that there is a clearance between the first drip edge and the edge of the first gripper hand while the wafer is being transported into the cleaning chamber, and wherein the first drip edge is fixed and integral with respect to the first hood, and wherein the second hood comprises a second drip edge that extends vertically downward from an edge portion of the second hood such that the second drip edge is thicker in a vertical direction than other portions of the second hood, and wherein the second drip edge extends horizontally past an edge of the second gripper hand such that there is a clearance between the second drip edge and the edge of the second gripper hand while the wafer is being transported out of the cleaning chamber, and wherein the second drip edge is fixed and integral with respect to the second hood, and wherein the cleaning chamber further comprises:
a portal through which the wafer may be passed between an interior of the cleaning chamber and an exterior of the cleaning chamber, and a surface of a door facing the interior of the cleaning chamber is coated with the hydrophobic layer; and
a nozzle plate disposed over the wafer while the wafer is secured in the cleaning chamber, wherein the nozzle plate is coated with the hydrophobic layer along a surface configured to face the wafer.

19. The system of claim 18, wherein a top surface of the first hood and a top surface of the second hood each have a greater area than a top surface of the wafer.

20. The system of claim 18, wherein the first drip edge is offset from an outermost portion of the edge portion of the first hood and the second drip edge is offset from an outermost portion of the edge portion of the second hood.

* * * * *